(12) United States Patent
Ji et al.

(10) Patent No.: US 9,437,554 B2
(45) Date of Patent: Sep. 6, 2016

(54) SEMICONDUCTOR PACKAGE HAVING MAGNETIC SUBSTANCE AND RELATED EQUIPMENT

(71) Applicants: Sang-Wook Ji, Seoul (KR);
Hyoung-Yol Mun, Yongin-si (KR);
Yeong-Lyeol Park, Yongin-si (KR);
In-Kyum Lee, Suwon-si (KR)

(72) Inventors: Sang-Wook Ji, Seoul (KR);
Hyoung-Yol Mun, Yongin-si (KR);
Yeong-Lyeol Park, Yongin-si (KR);
In-Kyum Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/330,636

(22) Filed: Jul. 14, 2014

(65) Prior Publication Data
US 2015/0130075 A1    May 14, 2015

(30) Foreign Application Priority Data
Nov. 12, 2013    (KR) ........................ 10-2013-0137002

(51) Int. Cl.
| H01L 23/02 | (2006.01) |
| H01L 23/00 | (2006.01) |
| H01L 21/56 | (2006.01) |
| H01L 23/498 | (2006.01) |

(52) U.S. Cl.
CPC ........... H01L 23/562 (2013.01); H01L 21/563 (2013.01); H01L 23/49816 (2013.01); H01L 23/49827 (2013.01); H01L 2224/16225 (2013.01); H01L 2924/0002 (2013.01); H01L 2924/15311 (2013.01)

(58) Field of Classification Search
CPC combination set(s) only.
See application file for complete search history.

(56) References Cited

U.S. PATENT DOCUMENTS

| 3,612,955 | A | * | 10/1971 | Butherus | ................... | H01F 7/20 |
| | | | | | | 228/180.21 |
| 6,186,392 | B1 | * | 2/2001 | Ball | ...................... | B23K 3/0623 |
| | | | | | | 228/180.22 |
| 7,432,114 | B2 | * | 10/2008 | Teshirogi | .............. | H01L 21/561 |
| | | | | | | 257/E21.503 |
| 7,830,011 | B2 | * | 11/2010 | Nomoto | .................. | H01L 23/12 |
| | | | | | | 257/758 |
| 8,138,868 | B2 | * | 3/2012 | Arnold | .......................... | 335/219 |
| 8,188,581 | B2 | * | 5/2012 | Shi | .......................... | H01L 23/13 |
| | | | | | | 257/673 |
| 8,586,410 | B2 | * | 11/2013 | Arnold | ..................... | H01L 24/95 |
| | | | | | | 257/E25.001 |
| 9,070,729 | B2 | * | 6/2015 | Ji et al. | | |
| 2004/0046248 | A1 | | 3/2004 | Waelti et al. | | |
| 2006/0197213 | A1 | * | 9/2006 | Lian | ................. | G06K 19/07749 |
| | | | | | | 257/687 |
| 2008/0218299 | A1 | * | 9/2008 | Arnold | .......................... | 335/306 |
| 2011/0074011 | A1 | * | 3/2011 | Shi | .......................... | H01L 23/13 |
| | | | | | | 257/723 |
| 2011/0291246 | A1 | * | 12/2011 | Jo et al. | ........................ | 257/621 |
| 2012/0014068 | A1 | * | 1/2012 | Nakanishi | .............. | H01L 23/10 |
| | | | | | | 361/717 |
| 2015/0093880 | A1 | * | 4/2015 | Ji et al. | ........................ | 438/459 |
| 2015/0130075 | A1 | * | 5/2015 | Ji et al. | ........................ | 257/774 |

FOREIGN PATENT DOCUMENTS

| JP | 09-018197 | 1/1997 |
| JP | 2005-268623 | 9/2005 |
| KR | 10-2012-0048840 A | 5/2012 |

* cited by examiner

*Primary Examiner* — Hoang-Quan Ho
(74) *Attorney, Agent, or Firm* — Myers Bigel & Sibley, PA

(57) ABSTRACT

Provided is a semiconductor device. A semiconductor chip is disposed on a substrate. A first magnetic substance, a second magnetic substance and a third magnetic substance which are spaced apart from one another are formed on the semiconductor chip. The first magnetic substance and the second magnetic substance can be adjacent an edge of the semiconductor chip. The third magnetic substance can be adjacent a center of the semiconductor chip. The third magnetic substance is between the first magnetic substance and the second magnetic substance.

14 Claims, 15 Drawing Sheets

SEMICONDUCTOR PACKAGE HAVING MAGNETIC SUBSTANCE AND RELATED EQUIPMENT

CROSS-REFERENCE TO RELATED APPLICATION

This application claims priority under 35 U.S.C. §119 to Korean Patent Application No. 10-2013-0137002, filed on Nov. 12, 2013, the disclosure of which is hereby incorporated by reference in its entirety.

FIELD

Embodiments of the inventive concept relate to a semiconductor package having a magnetic substance, a method of forming the same and related equipment.

BACKGROUND

In forming a semiconductor package, various techniques for improving solder ball failures caused by warpage of a semiconductor chip are being studied.

SUMMARY

Embodiments of the inventive concept provide a semiconductor package capable of inhibiting or preventing a failure caused by warpage of a semiconductor chip.

Other embodiments of the inventive concept provide a method of forming a semiconductor package capable inhibiting or of preventing a failure caused by warpage of a semiconductor chip.

Still other embodiments of the inventive concept provide fabricating equipment of a semiconductor package capable of inhibiting or preventing a failure caused by warpage of a semiconductor chip.

The technical objectives of the inventive concept are not limited to the above; other objectives may become apparent to those of ordinary skill in the art based on the following.

In accordance with an aspect of the inventive concept, a semiconductor package is provided. The semiconductor package includes a semiconductor chip disposed on a substrate. A first magnetic substance, a second magnetic substance and a third magnetic substance are formed to be spaced apart from one another on the semiconductor chip. The first magnetic substance and the second magnetic substance are close to or adjacent an edge of the semiconductor chip, the third magnetic substance is close to or adjacent a center of the semiconductor chip, and the third magnetic substance is formed between the first magnetic substance and the second magnetic substance.

In some embodiments, each of the first magnetic substance, the second magnetic substance and the third magnetic substance protrudes from the semiconductor chip and between the substrate and the semiconductor chip.

A fourth magnetic substance, a fifth magnetic substance and a sixth magnetic substance may be formed to be spaced apart from one another on the substrate. The fourth magnetic substance may face the first magnetic substance, the fifth magnetic substance may face the second magnetic substance, and the sixth magnetic substance may face the third magnetic substance.

A lower end of the first magnetic substance may have the same magnetic pole or polarity as an upper end of the fourth magnetic substance that faces the lower end of the first magnetic substance. A lower end of the second magnetic substance may have the same magnetic pole or polarity as an upper end of the fifth magnetic substance that faces the lower end of the second magnetic substance. A lower end of the third magnetic substance may have a different or opposite magnetic pole or polarity from an upper end of the sixth magnetic substance that faces the lower end of the third magnetic substance.

The substrate may include a printed circuit board, an interposer, another semiconductor chip, or a combination thereof.

The substrate may not include a magnetic substance.

The semiconductor chip may include through electrodes.

Other embodiments of the inventive concept provide a semiconductor package. The semiconductor package includes a semiconductor chip disposed on a substrate. A first magnetic substance and a second magnetic substance are formed to be spaced apart from each other on the semiconductor chip. The first magnetic substance and the second magnetic substance are close to or adjacent an edge of the semiconductor chip.

A third magnetic substance and a fourth magnetic substance may be formed to be spaced apart from each other on the substrate. The third magnetic substance may face the first magnetic substance, and the fourth magnetic substance may face the second magnetic substance.

A lower end of the first magnetic substance may have a different or opposite magnetic pole or polarity from an upper end of the third magnetic substance that faces the lower end of the first magnetic substance. A lower end of the second magnetic substance may have a different or opposite magnetic pole or polarity from an upper end of the fourth magnetic substance that faces the lower end of the second magnetic substance.

A fifth magnetic substance disposed on the semiconductor chip and formed between the first magnetic substance and the second magnetic substance may be provided. A sixth magnetic substance disposed on the substrate and facing the fifth magnetic substance may be provided.

A lower end of the fifth magnetic substance may have a different or opposite magnetic pole or polarity from an upper end of the sixth magnetic substance that faces the lower end of the fifth magnetic substance.

The substrate may not include a magnetic substance.

Still other embodiments of the inventive concept provide semiconductor package fabricating equipment. The fabricating equipment includes a bonding stage on which a substrate and a semiconductor chip are seated. A bonding head is disposed on the bonding stage. The semiconductor chip has a first magnetic substance and a second magnetic substance. The bonding stage has a third magnetic substance and a fourth magnetic substance. The third magnetic substance faces the first magnetic substance, and the fourth magnetic substance faces the second magnetic substance.

The bonding stage may include a fifth magnetic substance formed between the third magnetic substance and the fourth magnetic substance.

Still other embodiments of the inventive concept provide semiconductor package. The semiconductor package includes a substrate and a semiconductor chip disposed on the substrate. A first magnetic member and a second magnetic member are spaced apart from each other on the semiconductor chip. The first magnetic member and the second magnetic member are at an edge portion of the semiconductor chip.

A third magnetic member and a fourth magnetic member that are spaced apart from each other may be provided on the substrate. The third magnetic member may be aligned with and face the first magnetic member, and the fourth magnetic member may be aligned with and face the second magnetic member.

A lower end of the first magnetic member may have an opposite magnetic polarity from an upper end of the third magnetic member that faces the lower end of the first magnetic member, and a lower end of the second magnetic member may have an opposite magnetic polarity from an upper end of the fourth magnetic member that faces the lower end of the second magnetic member.

A fifth magnetic member may be disposed on the semiconductor chip at a center portion thereof and between the first magnetic member and the second magnetic member. A sixth magnetic member may be disposed on the substrate and may be aligned with and face the fifth magnetic member.

A lower end of the fifth magnetic member may have an opposite magnetic polarity from an upper end of the sixth magnetic member that faces the lower end of the fifth magnetic member.

Details of other embodiments are included in the detailed description and drawings.

BRIEF DESCRIPTION OF THE DRAWINGS

The foregoing and other features and advantages of the inventive concept will be apparent from the more particular description of preferred embodiments of the inventive concept, as illustrated in the accompanying drawings. The drawings are not necessarily to scale, emphasis instead being placed upon illustrating the principles of the inventive concept. In the drawings.

DETAILED DESCRIPTION OF THE EMBODIMENTS

Figure 1:
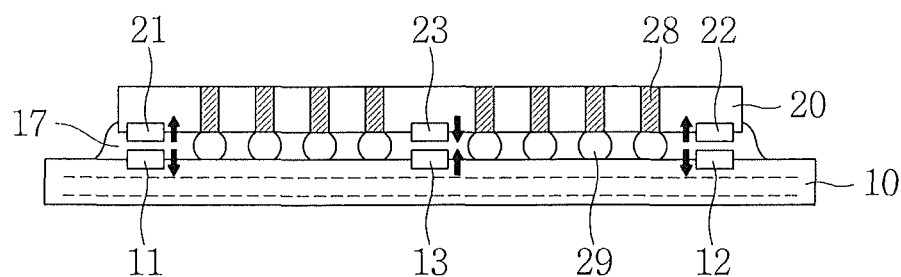
FIG. 1 is a cross-sectional view illustrating a semiconductor package in accordance with embodiments of the inventive concept.

Various embodiments will now be described more fully with reference to the accompanying drawings in which some embodiments are shown. The inventive concept may, however, be embodied in different forms and should not be construed as limited to the embodiments set forth herein. Rather, these embodiments are provided so that this disclosure is thorough and complete and fully conveys the inventive concept to those skilled in the art.

The terminology used herein to describe embodiments of the inventive concept is not intended to limit the scope of the inventive concept. The articles "a," "an," and "the" are singular in that they have a single referent; however, the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the sizes and relative sizes of layers and regions may be exaggerated for clarity. It will be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted into non-implanted region.

Terms such as "front side" and "back side" may be used in a relative sense herein to facilitate easy understanding of the inventive concept. Accordingly, "front side" and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

Unless otherwise defined, all terms (including technical and scientific terms) used herein are to be interpreted as is customary in the art to which this inventive concept belongs. It will be further understood that terms in common usage should also be interpreted as is customary in the relevant art and not in an idealized or overly formal sense unless expressly so defined herein.

Figure 2:
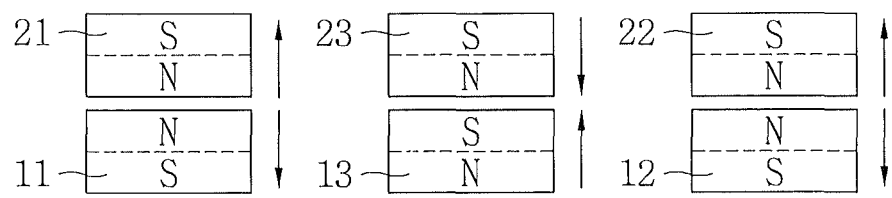
FIGS. 2 and 3 are enlarged views showing features of the semiconductor package of FIG. 1 in detail.
Figure 3:
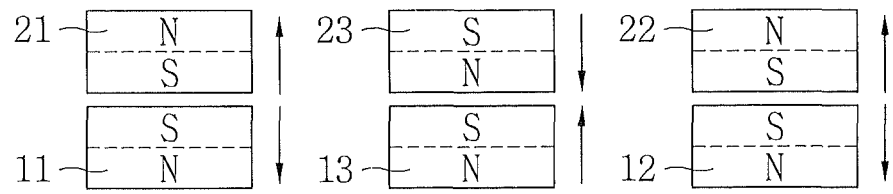
Figure 4:
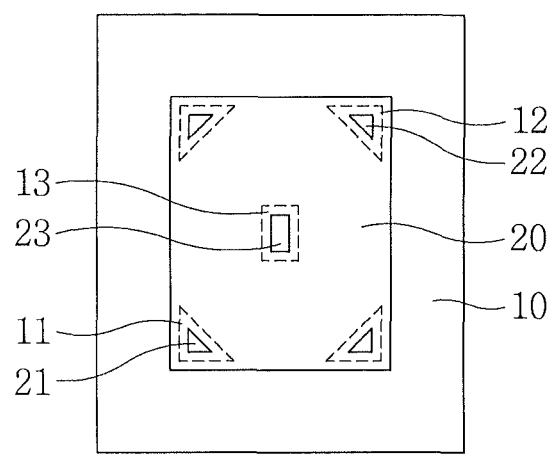
FIGS. 4 to 6 are schematic diagrams illustrating layouts for a semiconductor package in accordance with embodiments of the inventive concept.
Figure 5:
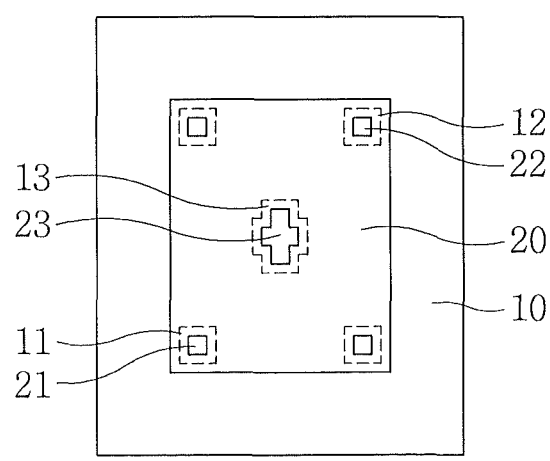
Figure 6:
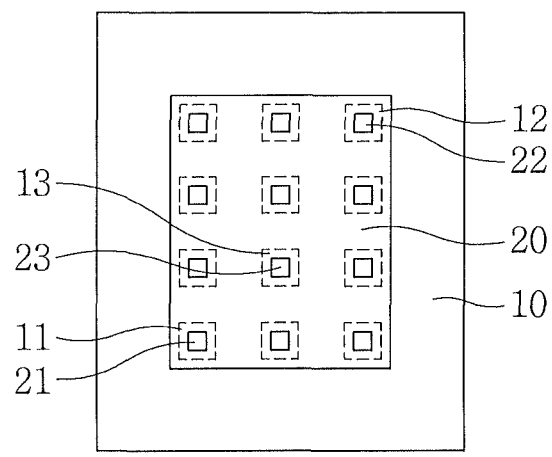

FIG. 1 is a cross-sectional view for describing a semiconductor package in accordance with embodiments of the inventive concept, FIGS. 2 and 3 are enlarged views showing a main configuration of FIG. 1 in detail, and FIGS. 4 to 6 are layouts for describing a semiconductor package in accordance with embodiments of the inventive concept.

Referring to FIG. 1, a first semiconductor chip 20 may be disposed on a substrate 10. An underfill layer 17 may be formed between the substrate 10 and the first semiconductor chip 20. A plurality of magnetic substances or members 11, 12, 13, 21, 22, and 23 may be formed on the substrate 10 and the first semiconductor chip 20. The first semiconductor chip 20 may include a plurality of first through electrodes 28. A plurality of first connection terminals 29 may be formed between the substrate 10 and the first semiconductor chip 20 through or in the underfill layer 17. The first through electrodes 28 may be electrically connected to the substrate 10 via the first connection terminals 29.

The substrate 10 may be a printed circuit board, an interposer, or another semiconductor chip. According to an embodiment of the inventive concept, the substrate 10 may be a rigid printed circuit board, a flexible printed circuit board, or a rigid-flexible printed circuit board. Each of the first through electrodes 28 may pass completely through the first semiconductor chip 20. The first semiconductor chip 20 may have a very small thickness due to an existence of the first through electrodes 28. For example, the first semiconductor chip 20 may have a thickness of 20 μM to 80 μm. The first semiconductor chip 20 may include a semiconductor substrate such as single-crystal silicon. The first through electrodes 28 may include Cu, W, WN, Ti, TiN, Ta, TaN, Al, Ni, Co, Pt, Ag, Au, Zn, Zr, or a combination thereof. The first connection terminals 29 may include a solder ball, a conductive bump, an anisotropic conductive film (ACF), or a combination thereof. Each of the magnetic substances 11, 12, 13, 21, 22, and 23 may include Fe, Co, Ni, Al, Mn, Mg, Zn, Cd, Ba, B, Sr, Nd, Sm, O, or a combination thereof. For example, each of the magnetic substances 11, 12, 13, 21, 22, and 23 may include Ferrite, SmCo, AlNiCo, NdFeB, or a combination thereof. Each of the magnetic substances 11, 12, 13, 21, 22, and 23 may include a ferromagnetic substance, a paramagnetic substance, a ferrimagnetic substance, or a combination thereof.

The magnetic substances 11, 12, 13, 21, 22, and 23 may include a first magnetic substance 21, a second magnetic substance 22, a third magnetic substance 23, a fourth magnetic substance 11, a fifth magnetic substance 12, and a sixth magnetic substance 13. The first magnetic substance 21, the second magnetic substance 22, and the third magnetic substance 23 may be formed on the first semiconductor chip 20. The second magnetic substance 22 may be spaced apart from the first magnetic substance 21. The first magnetic substance 21 and the second magnetic substance 22 may be close to an edge of the first semiconductor chip 20. In other words, the first magnetic substance 21 and the second magnetic substance 22 may be at an edge portion of the first semiconductor chip 20. The third magnetic substance 23 may be formed between the first magnetic substance 21 and the second magnetic substance 22. The third magnetic substance 23 may be close to a center of the first semiconductor chip 20. In other words, the third magnetic substance 23 may be at a center portion of the first semiconductor chip 20. Each of the first magnetic substance 21, the second magnetic substance 22, and the third magnetic substance 23 may protrude from and below a lower surface of the first semiconductor chip 20.

The fourth magnetic substance 11, the fifth magnetic substance 12, and the sixth magnetic substance 13 may be formed on the substrate 10. The fourth magnetic substance 11 may be formed to face the first magnetic substance 21, the fifth magnetic substance 12 may be formed to face the second magnetic substance 22, and the sixth magnetic substance 13 may be formed to face the third magnetic substance 23. The fourth magnetic substance 11 may be vertically arranged on or aligned with the first magnetic substance 21, the fifth magnetic substance 12 may be vertically arranged on or aligned with the second magnetic substance 22, and the sixth magnetic substance 13 may be vertically arranged on or aligned with the third magnetic substance 23. Each of the fourth magnetic substance 11, the fifth magnetic substance 12, and the sixth magnetic substance 13 may protrude from and above an upper surface of the substrate 10.

A lower end of the first magnetic substance 21 and an upper end of the fourth magnetic substance 11 may have the same magnetic pole or polarity, a lower end of the second magnetic substance 22 and an upper end of the fifth magnetic substance 12 may have the same magnetic pole or polarity, a lower end of the third magnetic substance 23 and an upper end of the sixth magnetic substance 13 may have a different magnetic pole or polarity from each other. A repulsive force may act between the lower end of the first magnetic substance 21 and the upper end of the fourth magnetic substance 11, a repulsive force may act between the lower end of the second magnetic substance 22 and the upper end of the fifth magnetic substance 12, and an attractive force may act between the lower end of the third magnetic substance 23 and the upper end of the sixth magnetic substance 13.

Referring to FIG. 2, the lower end of the first magnetic substance 21 and the upper end of the fourth magnetic substance 11 may be N-poles or have N-polarity. The lower end of the second magnetic substance 22 and the upper end of the fifth magnetic substance 12 may be N-poles or have N-polarity. The lower end of the third magnetic substance 23 may be an N-pole or have N-polarity and the upper end of the sixth magnetic substance 13 may be an S-pole or have S-polarity. A repulsive force may act between the lower end of the first magnetic substance 21 and the upper end of the fourth magnetic substance 11, a repulsive force may act between the lower end of the second magnetic substance 22 and the upper end of the fifth magnetic substance 12, and an attractive force may act between the lower end of the third magnetic substance 23 and the upper end of the sixth magnetic substance 13.

Referring to FIG. 3, the lower end of the first magnetic substance 21 and the upper end of the fourth magnetic substance 11 may be S-poles or have S-polarity. The lower end of the second magnetic substance 22 and the upper end of the fifth magnetic substance 12 may have S-poles or have S-polarity. The lower end of the third magnetic substance 23 may have an N-pole or have N-polarity and the upper end of the sixth magnetic substance 13 may have an S-pole or have S-polarity. A repulsive force may act between the lower end of the first magnetic substance 21 and the upper end of the fourth magnetic substance 11, a repulsive force may act between the lower end of the second magnetic substance 22 and the upper end of the fifth magnetic substance 12, and an attractive force may act between the lower end of the third magnetic substance 23 and the upper end of the sixth magnetic substance 13.

Referring to FIG. 4, the magnetic substances 11, 12, 13, 21, 22, and 23 may be distributed adjacent to corners and a center of the first semiconductor chip 20. For example, the first magnetic substance 21 and the fourth magnetic substance 11 may be formed close to one corner of the first semiconductor chip 20 or at a first corner portion of the first semiconductor chip 20, the second magnetic substance 22 and the fifth magnetic substance 12 may be formed close to another corner of the first semiconductor chip 20 or at a second corner portion of the first semiconductor chip 20, and the third magnetic substance 23 and the sixth magnetic substance 13 may be formed close to a center of the first semiconductor chip 20 or at a center portion of the first semiconductor chip 20. Each of the magnetic substances 11, 12, 13, 21, 22, and 23 may have various shapes. For example, the first magnetic substance 21, the second magnetic substance 22, the fourth magnetic substance 11, and the fifth magnetic substance 12 may have a triangular shape, and the third magnetic substance 23 and the sixth magnetic substance 13 may have a rectangular shape or a bar shape.

In other embodiments, each of the magnetic substances 11, 12, 13, 21, 22, and 23 may have a rectangular shape, a circle shape, a cross shape, a polygonal shape, an ameba shape, an irregular shape or a combination thereof. Each of the magnetic substances 11, 12, 13, 21, 22, and 23 may be alternately and repeatedly formed at the edge and inside of the first semiconductor chip 20.

Referring to FIG. 5, the first magnetic substance 21, the second magnetic substance 22, the fourth magnetic substance 11, and the fifth magnetic substance 12 may have a rectangular shape, and the third magnetic substance 23 and the sixth magnetic substance 13 may have a cross shape.

Referring to FIG. 6, each of the magnetic substances 11, 12, 13, 21, 22, and 23 may be alternately and repeatedly formed at the edge and inside of the first semiconductor chip 20.

Figure 7:
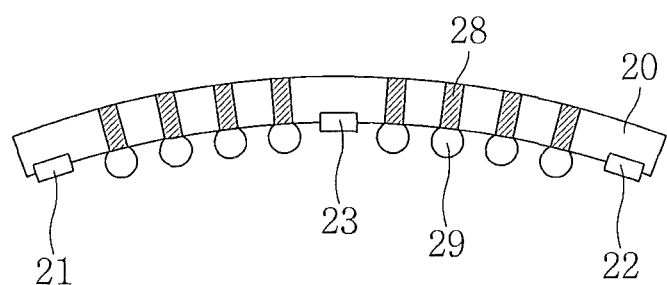
FIGS. 7 to 9 are cross-sectional views illustrating a method of forming a semiconductor package in accordance with embodiments of the inventive concept.
Figure 8:
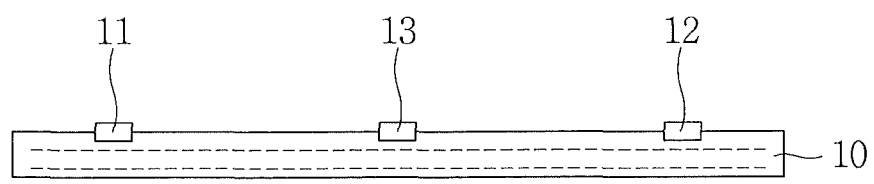
Figure 9:
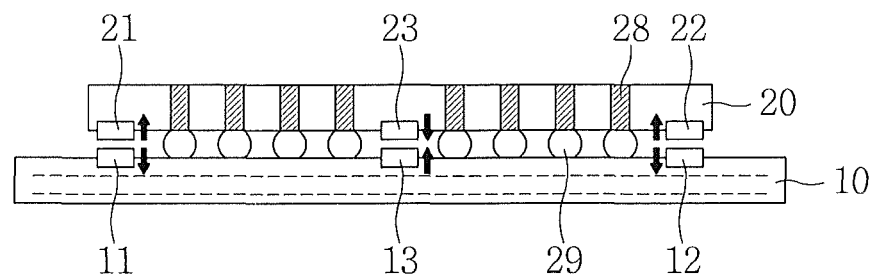

FIGS. 7 to 9 are cross-sectional views for describing a method of forming a semiconductor package in accordance with embodiments of the inventive concept.

Referring to FIG. 7, a first magnetic substance or member 21, a second magnetic substance or member 22 and a third magnetic substance or member 23 may be formed on a first semiconductor chip 20. The first semiconductor chip 20 may include a plurality of first through electrodes 28. First connection terminals 29 may be formed on the first through electrodes 28. The first semiconductor chip 20 may have a very small thickness due to an existence of the first through electrodes 28. For example, the first semiconductor chip 20 may have a thickness of 20 μm to 80 μm. Warpage in the shape of crying or frowning (∩) (e.g., an upside-down U shape or a "flattened" upside-down U shape) may occur in the first semiconductor chip 20. That is, the surface having the first, second and third magnetic substances 21, 22, 23 may be concave.

The first magnetic substance 21 and the second magnetic substance 22 may be close to an edge of the semiconductor chip 20 or at an edge portion of the semiconductor chip 20. The second magnetic substance 22 may be spaced apart from the first magnetic substance 21. The third magnetic substance 23 may be formed between the first magnetic substance 21 and the second magnetic substance 22. The third magnetic substance 23 may be close to a center of the first semiconductor chip 20 or at a center portion of the semiconductor chip 20. Each of the first magnetic substance 21, the second magnetic substance 22, and the third magnetic substance 23 may protrude from and below a lower surface of the semiconductor chip 20.

Referring to FIG. 8, a fourth magnetic substance 11, a fifth magnetic substance 12 and a sixth magnetic substance 13 may be formed on a substrate 10. The sixth magnetic substance 13 may be formed between the fourth magnetic substance 11 and the fifth magnetic substance 12. Each of the fourth magnetic substance 11, the fifth magnetic substance 12, and the sixth magnetic substance 13 may protrude from and above an upper surface of the substrate 10.

Referring to FIG. 9, the first semiconductor chip 20 may be attached on the substrate 10. The first connection terminals 29 may be in contact with the substrate 10 and the first semiconductor chip 20. The semiconductor chip 20 may be electrically connected to the substrate 10 via the first connection terminals 29. The first through electrodes 28 may be electrically connected to the substrate 10 via the first connection terminals 29.

A lower end of the first magnetic substance 21 and an upper end of the fourth magnetic substance 11 may have the same magnetic pole or polarity, a lower end of the second magnetic substance 22 and an upper end of the fifth magnetic substance 12 may have the same magnetic pole or polarity, and a lower end of the third magnetic substance 23 and an upper end of the sixth magnetic substance 13 may have a different magnetic pole or polarity from each other. A repulsive force may act between a lower end of the first magnetic substance 21 and an upper end of the fourth magnetic substance 11, a repulsive force may act between a lower end of the second magnetic substance 22 and an upper end of the fifth magnetic substance 12, and an attractive force may act between a lower end of the third magnetic substance 23 and an upper end of the sixth magnetic substance 13.

The magnetic substances 11, 12, 13, 21, 22, and 23 may serve to temper warpage in the shape of crying (∩) (as described above) occurring in the first semiconductor chip 20. Even though warpage in the shape of crying (∩) may occur in the first semiconductor chip 20, due to an existence of the magnetic substances 11, 12, 13, 21, 22, and 23, a failure of the first connection terminals 29 may be prevented.

FIGS. 10 to 16 are cross-sectional views for describing a semiconductor package in accordance with embodiments of the inventive concept.

Figure 10:
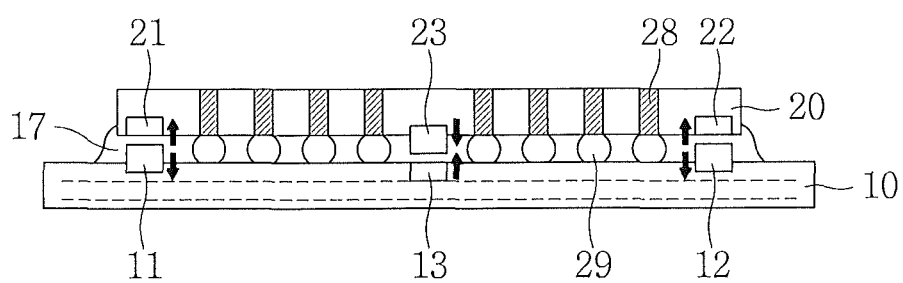
FIGS. 10 to 16 are cross-sectional views illustrating a semiconductor package in accordance with embodiments of the inventive concept.

Referring to FIG. 10, a first magnetic substance or member 21 and a second magnetic substance or member 22 may be buried in a first semiconductor chip 20. Lower ends of the first magnetic substance 21 and the second magnetic substance 22 may be exposed at the same level as a lower surface of the first semiconductor chip 20. A third magnetic substance or member 23 may protrude from and below the lower surface of the first semiconductor chip 20. A fourth magnetic substance or member 11 and a fifth magnetic substance or member 12 may protrude from and above an upper surface of a substrate 10. A sixth magnetic substance or member 13 may be buried in the substrate 10. An upper end of the sixth magnetic substance 13 may be exposed at the same level as the upper surface of the substrate 10.

Figure 11:
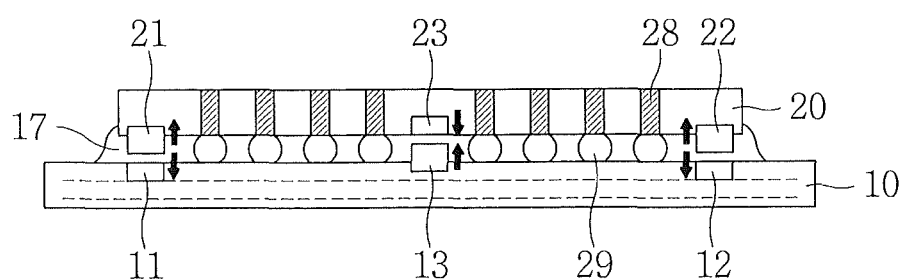

Referring to FIG. 11, lower ends of a first magnetic substance or member 21 and a second magnetic substance or member 22 may protrude from and below a lower surface of a first semiconductor chip 20. A third magnetic substance or member 23 may be buried in the first semiconductor chip 20. A lower end of the third magnetic substance 23 may be exposed at the same level as the lower surface of the first semiconductor chip 20. A fourth magnetic substance or member 11 and a fifth magnetic substance or member 12 may be buried in a substrate 10. Upper ends of the fourth magnetic substance 11 and the fifth magnetic substance 12 may be exposed at the same level as an upper surface of the substrate 10. An upper end of a sixth magnetic substance or member 13 may protrude from and above the upper surface of the substrate 10.

Figure 12:
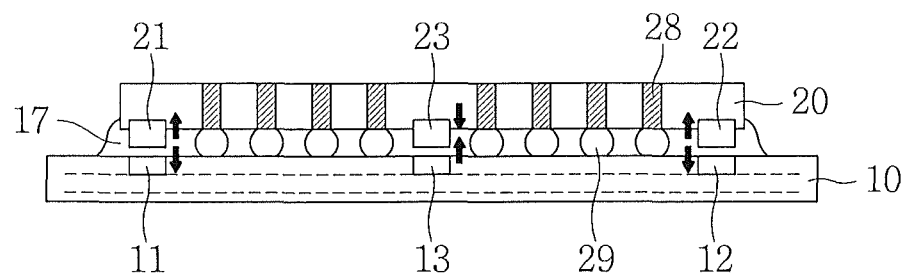

Referring to FIG. 12, lower ends of a first magnetic substance or member 21, a second magnetic substance or member 22, and a third magnetic substance or member 23 may protrude from and below a lower surface of a first semiconductor chip 20. A fourth magnetic substance or member 11, a fifth magnetic substance or member 12, and a sixth magnetic substance or member 13 may be buried in a substrate 10. Upper ends of the fourth magnetic substance 11, the fifth magnetic substance 12, and the sixth magnetic substance 13 may be exposed at the same level as an upper surface of the substrate 10.

Figure 13:
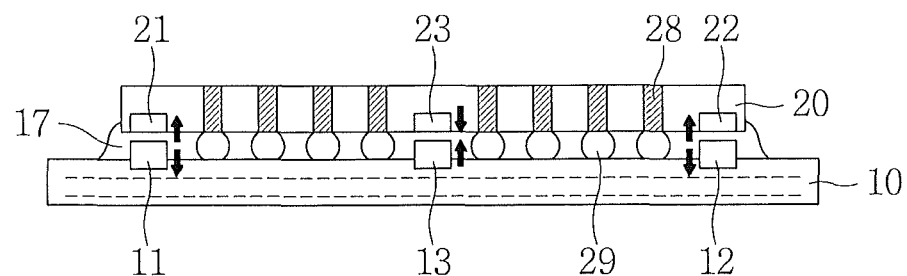

Referring to FIG. 13, a first magnetic substance or member 21, a second magnetic substance or member 22, and a third magnetic substance or member 23 may be buried in the first semiconductor chip 20. Lower ends of the first magnetic substance 21, the second magnetic substance 22, and the third magnetic substance 23 may be exposed at the same level as a lower surface of the first semiconductor chip 20. A fourth magnetic substance or member 11, a fifth magnetic substance or member 12, and a sixth magnetic substance or member 13 may protrude from and above an upper surface of the substrate 10.

Figure 14:
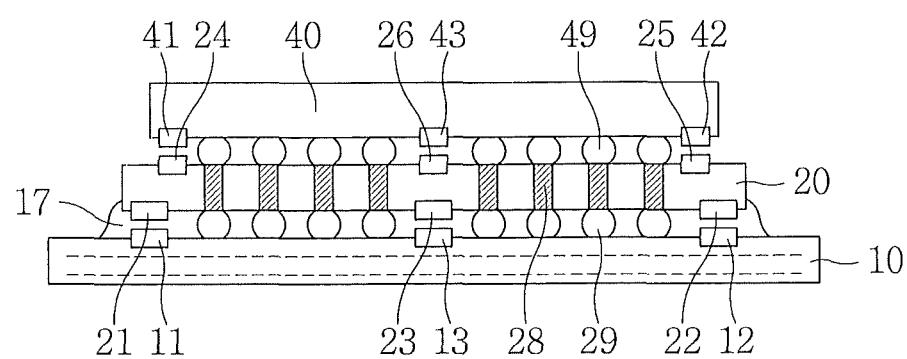

Referring to FIG. 14, a second semiconductor chip 40 may be disposed on a first semiconductor chip 20. Second connection terminals 49 may be formed between the first semiconductor chip 20 and the second semiconductor chip 40. The second connection terminals 49 may include a solder ball, a conductive bump, an ACF, or a combination thereof. The first semiconductor chip 20 may include first through electrodes 28. The second connection terminals 49 may be connected to upper ends of the first through electrodes 28. The second semiconductor chip 40 may be electrically connected to the first through electrodes 28 via the second connection terminals 49. The second semiconductor chip 40 may have a different horizontal width or a different area than the first semiconductor chip 20. The second semiconductor chip 40 may have a smaller horizontal width or smaller area than the first semiconductor chip 20.

A seventh magnetic substance or member 24, an eighth magnetic substance or member 25 and a ninth magnetic substance or member 26 may be formed on the first semiconductor chip 20. A tenth magnetic substance or member 41, an eleventh magnetic substance or member 42 and a twelfth magnetic substance or member 43 may be formed on the second semiconductor chip 40. The tenth magnetic substance 41 and the eleventh magnetic substance 42 may be formed close to edges of the second semiconductor chip 40. That is, the tenth magnetic substance 41 and the eleventh magnetic substance 42 may be at an edge portion of the second semiconductor chip 40. The tenth magnetic substance 41 and the eleventh magnetic substance 42 may be spaced apart from each other. The twelfth magnetic substance 43 may be formed between the tenth magnetic substance 41 and the eleventh magnetic substance 42. The twelfth magnetic substance 43 may be formed close to a center of the second semiconductor chip 40. That is, the twelfth magnetic substance 43 may be at a center portion of the second semiconductor chip 40. The seventh magnetic substance 24 may face or be aligned with the tenth magnetic substance 41, the eighth magnetic substance 25 may face or be aligned with the eleventh magnetic substance 42, and the ninth magnetic substance 26 may face or be aligned with the twelfth magnetic substance 43.

Figure 15:
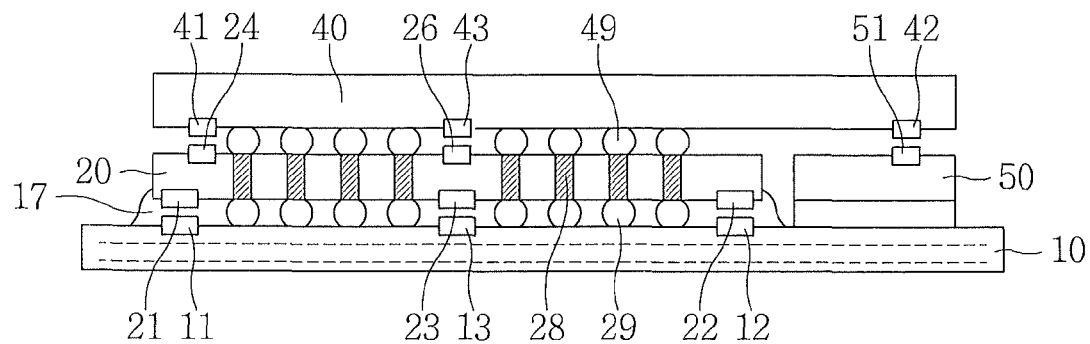

Referring to FIG. 15, a first semiconductor chip 20 and a spacer 50 may be disposed on a substrate 10. Upper ends of the first semiconductor chip 20 and the spacer 50 may be formed at the same level. A second semiconductor chip 40 may be disposed on the first semiconductor chip 20 and the spacer 50. The second semiconductor chip 40 may have a different horizontal width or different area than the first semiconductor chip 20. The second semiconductor chip 40 may have a greater horizontal width or greater area than the first semiconductor chip 20.

A seventh magnetic substance or member 24 and a ninth magnetic substance or member 26 may be formed on the first semiconductor chip 20. A tenth magnetic substance or member 41, an eleventh magnetic substance or member 42 and a twelfth magnetic substance or member 43 may be formed on the second semiconductor chip 40. A thirteenth magnetic substance or member 51 may be formed on the spacer 50. The tenth magnetic substance 41 and the eleventh magnetic substance 42 may be formed close to edges of the second semiconductor chip 40. That is, the tenth magnetic substance 41 and the eleventh magnetic substance 42 may be at an edge portion of the second semiconductor chip 40. The twelfth magnetic substance 43 may be formed between the tenth magnetic substance 41 and the eleventh magnetic substance 42. The twelfth magnetic substance 43 may be formed close to a center of the second semiconductor chip 40. That is, the twelfth magnetic substance 43 may be at a center portion of the second semiconductor chip 40. The seventh magnetic substance 24 may face or be aligned with the tenth magnetic substance 41, the thirteenth magnetic substance 51 may face or be aligned with the eleventh magnetic substance 42, and the ninth magnetic substance 26 may face or be aligned with the twelfth magnetic substance 43.

Figure 16:
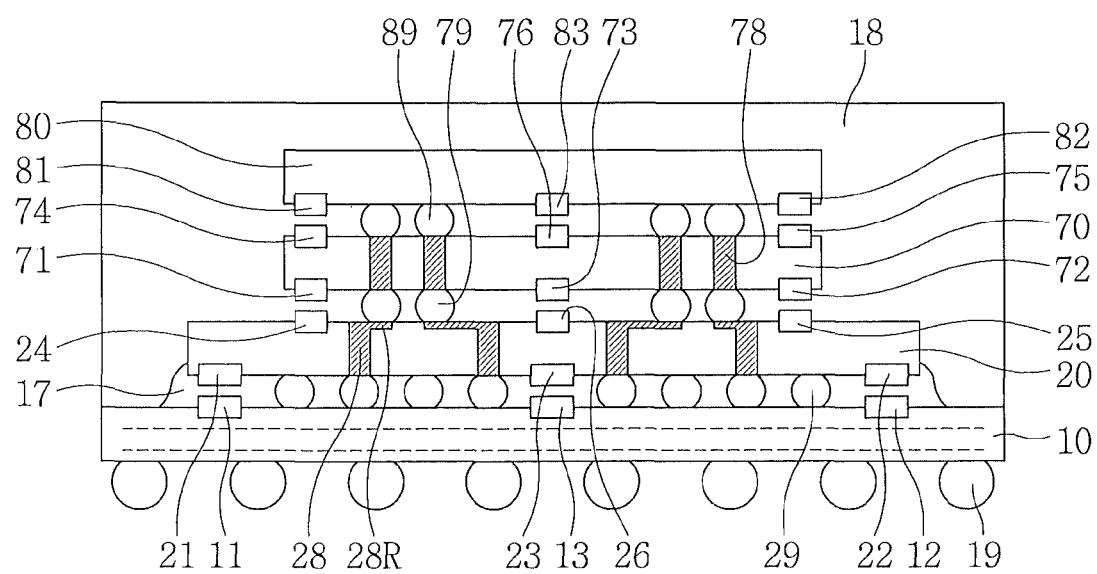

Referring to FIG. 16, a first semiconductor chip 20 may be disposed on a substrate 10. A third semiconductor chip 70 may be disposed on the first semiconductor chip 20. A fourth semiconductor chip 80 may be disposed on the third semiconductor chip 70. An encapsulant 18 covering the first semiconductor chip 20, the third semiconductor chip 70, and the fourth semiconductor chip 80 may be formed on the substrate 10. External terminals 19 may be formed at a lower end or surface of the substrate 10. Third connection terminals 79 may be formed between the first semiconductor chip 20 and the third semiconductor chip 70. The first semiconductor chip 20 may include first through electrodes 28 and a redistribution layer 28R. The third semiconductor chip 70 may include second through electrodes 78. The third connection terminals 79 may be connected to the redistribution layer 28R and the second through electrodes 78. Fourth connection terminals 89 may be formed between the third semiconductor chip 70 and the fourth semiconductor chip 80.

The third connection terminals 79 and the fourth connection terminals 89 may include a solder ball, a conductive bump, an ACF, or a combination thereof. The external terminals 19 may include a solder ball, a conductive bump, a conductive tab, a lead grid array (LGA), a pin grid array (PGA), or a combination thereof. The encapsulant 18 may include a molding compound.

A seventh magnetic substance or member 24, an eighth magnetic substance or member 25 and a ninth magnetic substance or member 26 may be formed on the first semiconductor chip 20. A fourteenth magnetic substance or member 71, a fifteenth magnetic substance or member 72, a sixteenth magnetic substance or member 73, a seventeenth magnetic substance or member 74, an eighteenth magnetic substance or member 75 and a nineteenth magnetic substance or member 76 may be formed on the third semiconductor chip 70. The fourteenth magnetic substance 71 and the fifteenth magnetic substance 72 may be formed close to edges of the third semiconductor chip 70 (e.g., at an edge portion of the third semiconductor chip 70). The sixteenth magnetic substance 73 may be formed between the fourteenth magnetic substance 71 and the fifteenth magnetic substance 72. The sixteenth magnetic substance 73 may be formed close to a center of the third semiconductor chip 70 (e.g., at a center portion of the third semiconductor chip 70). The seventh magnetic substance 24 may be formed to face or be aligned with the fourteenth magnetic substance 71, the eighth magnetic substance 25 may be formed to face or be aligned with the fifteenth magnetic substance 72, and the ninth magnetic substance 26 may be formed to face or be aligned with the sixteenth magnetic substance 73.

A twentieth magnetic substance or member 81, a twenty-first magnetic substance or member 82 and a twenty-second magnetic substance or member 83 may be formed on the fourth semiconductor chip 80. The twentieth magnetic substance 81 and the twenty-first magnetic substance 82 may be formed close to edges of the fourth semiconductor chip 80 (e.g., at an edge portion of the fourth semiconductor chip 80). The twenty-second magnetic substance 83 may be formed between the twentieth magnetic substance 81 and the twenty-first magnetic substance 82. A twenty-second magnetic substance 83 may be formed close to a center of the fourth semiconductor chip 80 (e.g., at a center portion of the fourth semiconductor chip 80). The seventeenth magnetic substance 74 may be formed to face or be aligned with the twentieth magnetic substance 81, the eighteenth magnetic substance 75 may be formed to face or be aligned with the twenty-first magnetic substance 82, and the nineteenth magnetic substance 76 may be formed to face or be aligned with the twenty-second magnetic substance 83.

The first magnetic substance 21, the second magnetic substance 22, the third magnetic substance 23, the fourth magnetic substance 11, the fifth magnetic substance 12, the sixth magnetic substance 13, the seventh magnetic substance 24, the eighth magnetic substance 25, the ninth magnetic substance 26, the fourteenth magnetic substance 71, the fifteenth magnetic substance 72, the sixteenth magnetic substance 73, the seventeenth magnetic substance 74, the eighteenth magnetic substance 75, the nineteenth magnetic substance 76, the twentieth magnetic substance 81, the twenty-first magnetic substance 82, and the twenty-second magnetic substance 83 may serve to inhibit or prevent warpage and to facilitate an alignment. For example, the first magnetic substance 21, the second magnetic substance 22, the fourth magnetic substance 11, the fifth magnetic substance 12, the seventh magnetic substance 24, the eighth magnetic substance 25, the fourteenth magnetic substance 71, the fifteenth magnetic substance 72, the seventeenth magnetic substance 74, the eighteenth magnetic substance 75, the twentieth magnetic substance 81, and the twenty-first magnetic substance 82 may serve to inhibit or prevent warpage. The third magnetic substance 23, the sixth magnetic substance 13, the ninth magnetic substance 26, the sixteenth magnetic substance 73, the nineteenth magnetic substance 76, and the twenty-second magnetic substance 83 may serve to facilitate an alignment.

In other embodiments, the first semiconductor chip 20 may be replaced with an interposer including a semiconductor substrate, a glass board, a printed circuit board, or a combination thereof. In still other embodiments, an interposer may be additionally inserted between the first semiconductor chip 20 and the third semiconductor chip 70.

Figure 17:
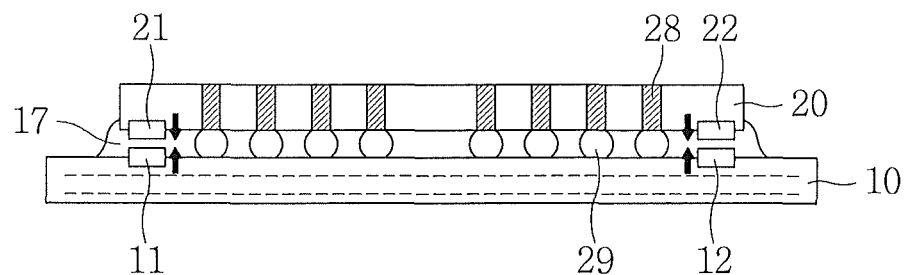
FIG. 17 is a cross-sectional view illustrating a semiconductor package in accordance with embodiments of the inventive concept.
Figure 18:
FIGS. 18 and 19 are enlarged views showing features of the semiconductor package of FIG. 17 in detail.
Figure 19:
Figure 20:
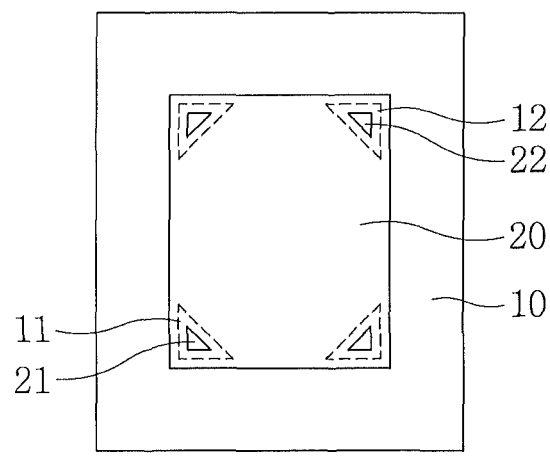
FIGS. 20 and 21 are schematic diagrams illustrating layouts for a semiconductor package in accordance with embodiments of the inventive concept.
Figure 21:
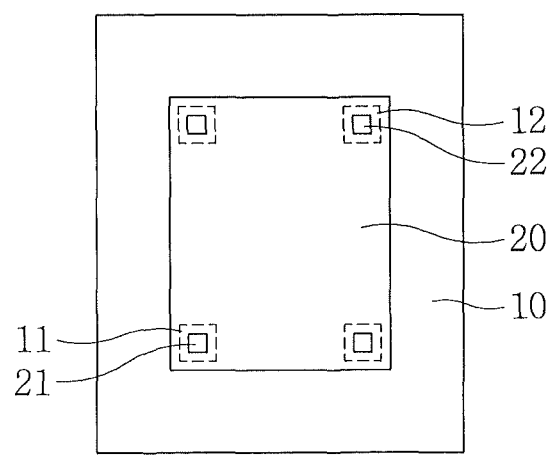

FIG. 17 is a cross-sectional view for describing a semiconductor package in accordance with embodiments of the inventive concept, FIGS. 18 and 19 are enlarged views showing a main configuration of FIG. 17 in detail, and FIGS. 20 and 21 are layouts for describing a semiconductor package in accordance with embodiments of the inventive concept.

Referring to FIG. 17, a first semiconductor chip 20 may be disposed on a substrate 10. An underfill layer 17 may be formed between the substrate 10 and the first semiconductor chip 20. A plurality of magnetic substances or members 11, 12, 21, and 22 may be formed on the substrate 10 and the first semiconductor chip 20. The first semiconductor chip 20 may include a plurality of first through electrodes 28. A plurality of first connection terminals 29 may be formed between the substrate 10 and the first semiconductor chip 20 through or in the underfill layer 17. The first through electrodes 28 may be electrically connected to the substrate 10 via the first connection terminals 29.

The magnetic substances 11, 12, 21, and 22 may include a first magnetic substance 21, a second magnetic substance 22, a fourth magnetic substance 11, and a fifth magnetic substance 12. The first magnetic substance 21 and the second magnetic substance 22 may be formed on the first semiconductor chip 20. The second magnetic substance 22 may be spaced apart from the first magnetic substance 21. The first magnetic substance 21 and the second magnetic substance 22 may be close to an edge of the first semiconductor chip 20 (e.g., at an edge portion of the first semiconductor chip 20).

The fourth magnetic substance 11 and the fifth magnetic substance 12 may be formed on the substrate 10. The fourth magnetic substance 11 may be formed to face the first magnetic substance 21, the fifth magnetic substance 12 may be formed to face the second magnetic substance 22, and the fourth magnetic substance 11 may be vertically arranged on or aligned with the first magnetic substance 21, and the fifth magnetic substance 12 may be vertically arranged on or aligned with the second magnetic substance 22.

A lower end of the first magnetic substance 21 and an upper end of the fourth magnetic substance 11 may have a different magnetic pole or polarity from each other, and a lower end of the second magnetic substance 22 and an upper end of the fifth magnetic substance 12 may have a different magnetic pole or polarity from each other. An attractive force may act between the lower end of the first magnetic substance 21 and the upper end of the fourth magnetic substance 11, and an attractive force may act between the lower end of the second magnetic substance 22 and the upper end of the fifth magnetic substance 12.

Referring to FIG. 18, a lower end of the first magnetic substance 21 may be an N-pole or have N-polarity, and an upper end of the fourth magnetic substance 11 may be an S-pole or have S-polarity. A lower end of the second magnetic substance 22 may be an N-pole or have N-polarity, and an upper end of the fifth magnetic substance 12 may be an S-pole or have S-polarity. An attractive force may act between the lower end of the first magnetic substance 21 and the upper end of the fourth magnetic substance 11, and an attractive force may act between the lower end of the second magnetic substance 22 and the upper end of the fifth magnetic substance 12.

Referring to FIG. 19, a lower end of the first magnetic substance 21 may be an S-pole or have S-polarity, and an upper end of the fourth magnetic substance 11 may be an N-pole or have N-polarity. A lower end of the second magnetic substance 22 may be an S-pole or have S-polarity, and an upper end of the fifth magnetic substance 12 may be an N-pole or have N-polarity. An attractive force may act between the lower end of the first magnetic substance 21 and the upper end of the fourth magnetic substance 11, and an attractive force may act between the lower end of the second magnetic substance 22 and the upper end of the fifth magnetic substance 12.

Referring to FIG. 20, the magnetic substances 11, 12, 21, and 22 may be distributed adjacent to corners of the first semiconductor chip 20. For example, the first magnetic substance 21 and the fourth magnetic substance 11 may be formed close to one corner of the first semiconductor chip 20, and the second magnetic substance 22 and the fifth magnetic substance 12 may be formed close to another corner of the first semiconductor chip 20. Each of the magnetic substances 11, 12, 21, and 22 may have various shapes. For example, the first magnetic substance 21, the second magnetic substance 22, the fourth magnetic substance 11, and the fifth magnetic substance 12 may have a triangular shape.

In other embodiments, each of the magnetic substances 11, 12, 21, and 22 may have a rectangular shape, a circle shape, a cross shape, a polygonal shape, an ameba shape, an irregular shape or a combination thereof. Each of the magnetic substances 11, 12, 21, and 22 may be alternately and repeatedly formed at the edge and inside of the first semiconductor chip 20.

Referring to FIG. 21, the first magnetic substance 21, the second magnetic substance 22, the fourth magnetic substance 11, and the fifth magnetic substance 12 may have a rectangular or square shape.

Figure 22:
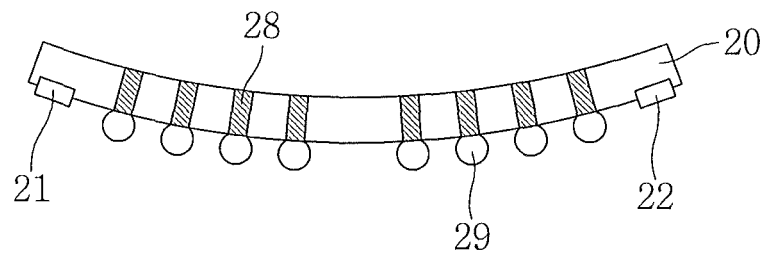
FIGS. 22 to 24 are cross-sectional views illustrating a method of forming a semiconductor package in accordance with embodiments of the inventive concept.
Figure 23:
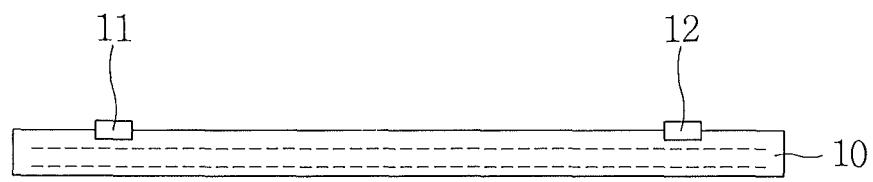
Figure 24:
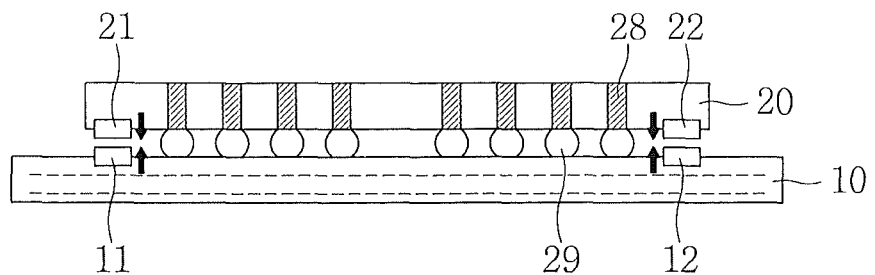

FIGS. 22 to 24 are cross-sectional views for describing a method of forming a semiconductor package in accordance with embodiments of the inventive concept.

Referring to FIG. 22, a first magnetic substance or member 21 and a second magnetic substance or member 22 may be formed on a first semiconductor chip 20. The first semiconductor chip 20 may include a plurality of first through electrodes 28. First connection terminals 29 may be formed on the first through electrodes 28. The first semiconductor chip 20 may have a very small thickness due to an existence of the first through electrodes 28. For example, the first semiconductor chip 20 may have a thickness of 20 μM to 80 μm. Warpage in the shape of smile (∪) (e.g., a U shape or a "flattened" U shape) may occur at the first semiconductor chip 20. In other words, the warpage may cause the surface having the first and second magnetic substances 21, 22 to be convex. The first magnetic substance 21 and the second magnetic substance 22 may be close to an edge of the first semiconductor chip 20 (e.g., at an edge portion of the first semiconductor chip 20). The second magnetic substance 22 may be spaced apart from the first magnetic substance 21.

Referring to FIG. 23, a fourth magnetic substance or member 11 and a fifth magnetic substance or member 12 may be formed on a substrate 10.

Referring to FIG. 24, the first semiconductor chip 20 may be attached on the substrate 10. The first connection terminals 29 may be in contact with the substrate 10 and the first semiconductor chip 20. The first semiconductor chip 20 may be electrically connected to the substrate 10 via the first connection terminals 29. The first through electrodes 28 may be electrically connected to the substrate 10 via the first connection terminals 29.

A lower end of the first magnetic substance 21 and an upper end of the fourth magnetic substance 11 may have a different magnetic pole or polarity from each other, and a lower end of the second magnetic substance 22 and an upper end of the fifth magnetic substance 12 may have a different magnetic pole or polarity from each other. An attractive force may act between the lower end of the first magnetic substance 21 and the upper end of the fourth magnetic substance 11, and an attractive force may act between the lower end of the second magnetic substance 22 and the upper end of the fifth magnetic substance 12.

The magnetic substances 11, 12, 21, and 22 may serve to temper warpage in the shape of smile (∪) (as described above) caused at the first semiconductor chip 20. Even though warpage in the shape of smile (∪) may occur at the first semiconductor chip 20, due to an existence of the magnetic substances 11, 12, 21, and 22, failures of the first connection terminals 29 may be prevented.

Figure 25:
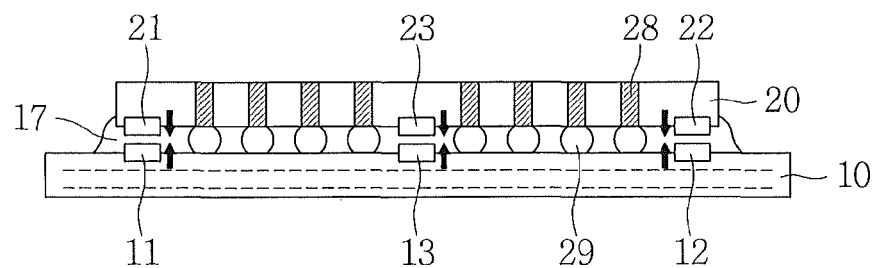
FIG. 25 is a cross-sectional view illustrating a semiconductor package in accordance with embodiments of the inventive concept.
Figure 26:
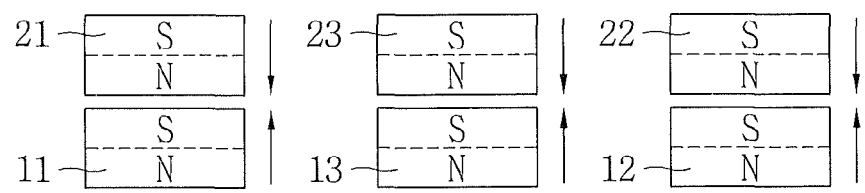
FIG. 26 is an enlarged view showing features of the semiconductor package of FIG. 25 in detail.

FIG. 25 is a cross-sectional view for describing a semiconductor package in accordance with embodiments of the inventive concept, and FIG. 26 is an enlarged view showing a main configuration of FIG. 25 in detail.

Referring to FIG. 25, a first semiconductor chip 20 may be disposed on a substrate 10. An underfill layer 17 may be formed between the substrate 10 and the first semiconductor chip 20. A plurality of magnetic substances or members 11, 12, 13, 21, 22, and 23 may be formed on the substrate 10 and the first semiconductor chip 20. The first semiconductor chip 20 may include a plurality of first through electrodes 28. A plurality of first connection terminals 29 may be formed between the substrate 10 and the first semiconductor chip 20 through or in the underfill layer 17. The first through electrodes 28 may be electrically connected to the substrate 10 via the first connection terminals 29.

The magnetic substances 11, 12, 13, 21, 22, and 23 may include a first magnetic substance 21, a second magnetic substance 22, a third magnetic substance 23, a fourth magnetic substance 11, a fifth magnetic substance 12, and a sixth magnetic substance 13. The first magnetic substance 21, the second magnetic substance 22, and the third magnetic substance 23 may be formed on the first semiconductor chip 20. The second magnetic substance 22 may be spaced apart from the first magnetic substance 21. The first magnetic substance 21 and the second magnetic substance 22 may be close to an edge of the first semiconductor chip 20 (e.g., at an edge portion of the first semiconductor chip 20). The third magnetic substance 23 may be formed between the first magnetic substance 21 and the second magnetic substance 22.

The fourth magnetic substance 11, the fifth magnetic substance 12, and the sixth magnetic substance 13 may be formed on the substrate 10. The fourth magnetic substance 11 may be formed to face the first magnetic substance 21, the fifth magnetic substance 12 may be formed to face the second magnetic substance 22, and the sixth magnetic substance 13 may be formed to face the third magnetic substance 23. The fourth magnetic substance 11 may be vertically arranged on or aligned with the first magnetic substance 21, the fifth magnetic substance 12 may be vertically arranged on or aligned with the second magnetic substance 22, and the sixth magnetic substance 13 may be vertically arranged on or aligned with the third magnetic substance 23.

A lower end of the first magnetic substance 21 and an upper end of the fourth magnetic substance 11 may have a different magnetic pole or polarity from each other, a lower end of the second magnetic substance 22 and an upper end of the fifth magnetic substance 12 may have a different magnetic pole or polarity from each other, and a lower end of the third magnetic substance 23 and an upper end of the sixth magnetic substance 13 may have a different magnetic pole or polarity from each other. An attractive force may act between the lower end of the first magnetic substance 21 and the upper end of the fourth magnetic substance 11, an attractive force may act between the lower end of the second magnetic substance 22 and the upper end of the fifth magnetic substance 12, and an attractive force may act between the lower end of the third magnetic substance 23 and the upper end of the sixth magnetic substance 13.

The magnetic substances 11, 12, 13, 21, 22, and 23 may serve to temper warpage in the shape of smile (∪) (as described above) caused at the first semiconductor chip 20. Even though warpage in the shape of smile (∪) may occur at the first semiconductor chip 20, due to an existence of the magnetic substances 11, 12, 13, 21, 22, and 23, failures of the first connection terminals 29 may be prevented.

Referring to FIG. 26, the lower end of the first magnetic substance 21 may be an N-pole, and the upper end of the fourth magnetic substance 11 may be an S-pole or have S-polarity. The lower end of the second magnetic substance 22 may be an N-pole or have N-polarity and the upper end of the fifth magnetic substance 12 may be an S-pole or have S-polarity. The lower end of the third magnetic substance 23 may be an N-pole or have N-polarity and the upper end of the sixth magnetic substance 13 may be an S-pole or have S-polarity. An attractive force may act between the lower end of the first magnetic substance 21 and the upper end of the fourth magnetic substance 11, an attractive force may act between the lower end of the second magnetic substance 22 and the upper end of the fifth magnetic substance 12, and an attractive force may act between the lower end of the third magnetic substance 23 and the upper end of the sixth magnetic substance 13.

Figure 27:
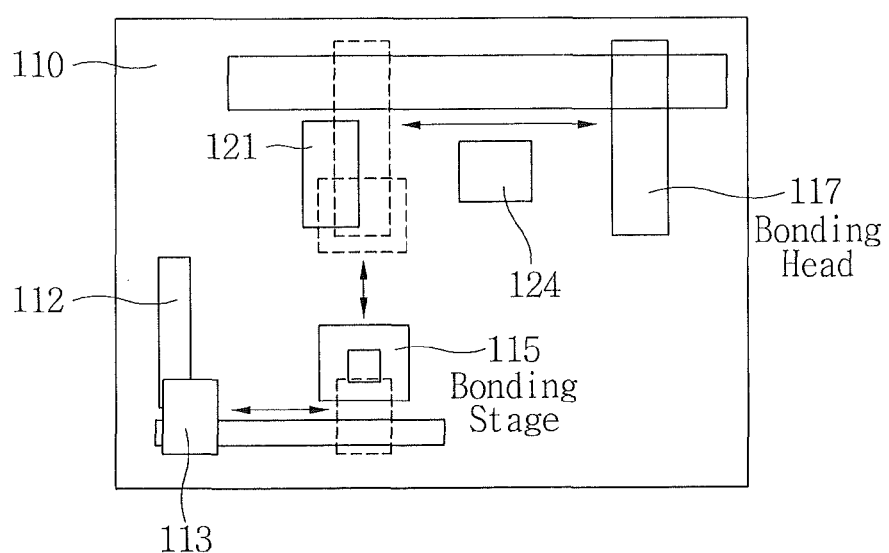
FIG. 27 is a schematic diagram illustrating fabricating equipment of a semiconductor package in accordance with embodiments of the inventive concept.
Figure 28:
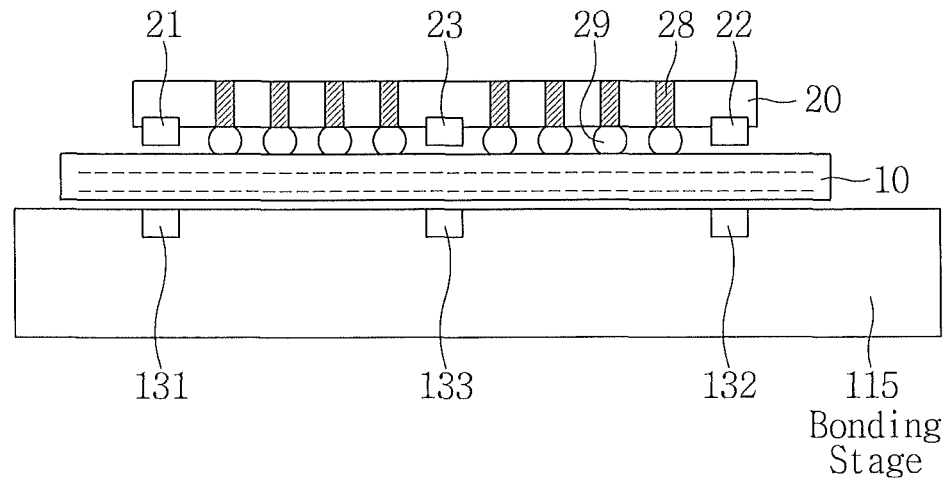
FIG. 28 is a cross-sectional view illustrating a method of forming a semiconductor package in accordance with embodiments of the inventive concept.
Figure 29:
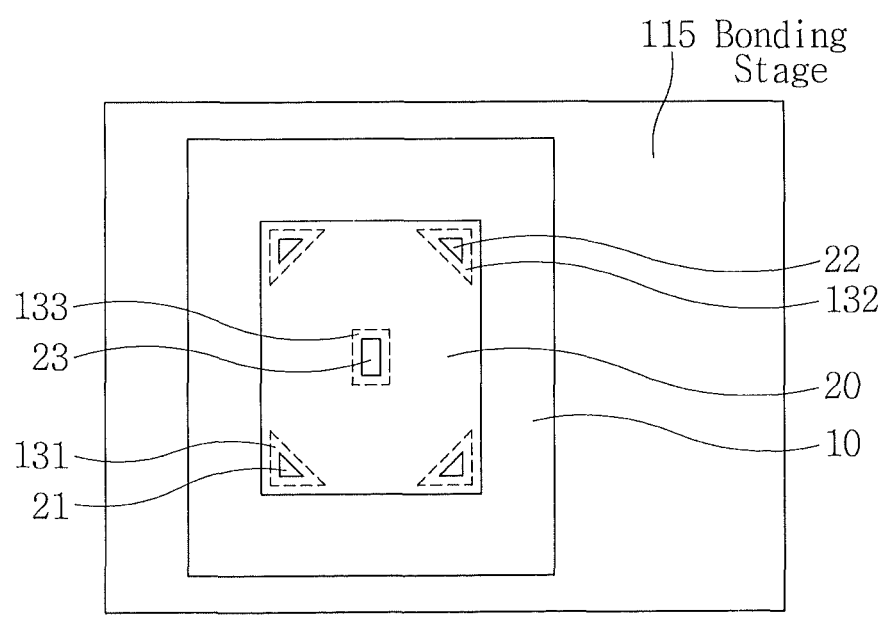
FIG. 29 is a schematic diagram for describing a method of forming a semiconductor package in accordance with embodiments of the inventive concept.
Figure 30:
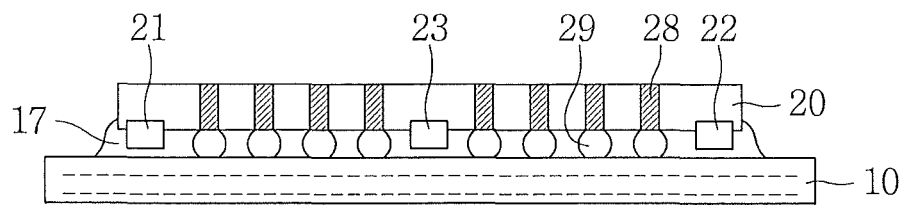
FIGS. 30 and 31 are cross-sectional views illustrating a method of forming a semiconductor package in accordance with embodiments of the inventive concept.
Figure 31:
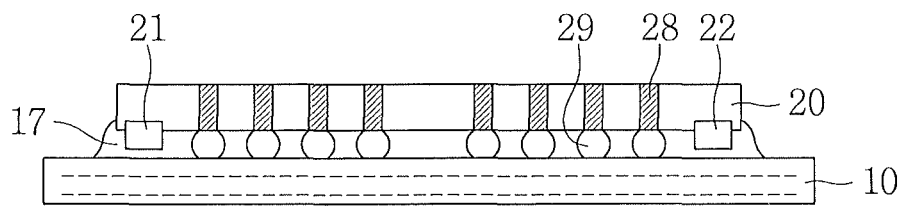

FIG. 27 is a schematic diagram for describing fabricating equipment of a semiconductor package in accordance with embodiments of the inventive concept, FIGS. 28, 30, and 31 are cross-sectional views for describing a method of forming a semiconductor package in accordance with embodiments of the inventive concept, and FIG. 29 is a schematic diagram for describing a method of forming a semiconductor package in accordance with embodiments of the inventive concept. Fabricating equipment in accordance with embodiments of the inventive concept may be a semiconductor chip bonding apparatus. For example, the fabricating equipment may be a flip chip bonder.

Referring to FIG. 27, semiconductor package fabricating equipment 110 in accordance with embodiments of the inventive concept may include a loader 112, a pick-up head 113, a bonding stage 115, a bonding head 117, an alignment camera 121, and an inspection camera 124. The bonding head 117, the alignment camera 121 and the inspection camera 124 may be moved to be arranged on or near the bonding stage 115. The loader 112 may be disposed adjacent to the bonding stage 115. The pick-up head 113 may be moved between the loader 112 and the bonding stage 115. A heating device such as an IR source may be included in the bonding stage 115, but description thereof will be omitted for the sake of brevity.

Referring to FIG. 28, the bonding stage 115 may include a twenty-third magnetic substance or member 131, a twenty-fourth magnetic substance or member 132 and a twenty-fifth magnetic substance or member 133. A substrate 10 may be seated on the bonding stage 115. A first semiconductor chip 20 may be seated on the substrate 10. The first semiconductor chip 20 may include a plurality of first through electrodes 28. A plurality of first connection terminals 29 may be formed between the substrate 10 and the first semiconductor chip 20. A first magnetic substance or member 21, a second magnetic substance or member 22 and a third magnetic substance or member 23 may be formed on the first semiconductor chip 20.

The second magnetic substance 22 may be spaced apart from the first magnetic substance 21. The first magnetic substance 21 and the second magnetic substance 22 may be close to an edge of the first semiconductor chip 20 (e.g., at an edge portion of the first semiconductor chip 20). The third magnetic substance 23 may be formed between the first magnetic substance 21 and the second magnetic substance 22. The twenty-third magnetic substance 131 may be formed to face the first magnetic substance 21, the twenty-fourth magnetic substance 132 may be formed to face the second magnetic substance 22, and the twenty-fifth magnetic substance 133 may be formed to face the third magnetic substance 23. The twenty-third magnetic substance 131 may be vertically arranged below or aligned with the first magnetic substance 21, the twenty-fourth magnetic substance 132 may be vertically arranged below or aligned with the second magnetic substance 22, and the twenty-fifth magnetic substance 133 may be vertically arranged below or aligned with the third magnetic substance 23.

While the first connection terminals 29 are formed between the substrate 10 and the first semiconductor chip 20, the magnetic substances 21, 22, 23, 131, 132, and 133 may serve to temper warpage caused at the first semiconductor chip 20. Even though warpage may occur at the first semiconductor chip 20, due to an existence of the magnetic substances 21, 22, 23, 131, 132, and 133, failures of the first connection terminals 29 may be prevented.

Referring to FIG. 29, the magnetic substances 21, 22, 23, 131, 132, and 133 may be distributed adjacent to the corners and center of the first semiconductor chip 20. For example, the first magnetic substance 21 and the twenty-third magnetic substance 131 may be formed close to one corner of the first semiconductor chip 20, the second magnetic substance 22 and the twenty-fourth magnetic substance 132 may be formed close to another corner of the first semiconductor chip 20, and the third magnetic substance 23 and the twenty-fifth magnetic substance 133 may be formed close to a center (or at a center portion) of the first semiconductor chip 20. Each of the magnetic substances 21, 22, 23, 131, 132, and 133 may have various shapes. For example, the first magnetic substance 21, the second magnetic substance 22, the twenty-third magnetic substance 131, and the twenty-fourth magnetic substance 132 may have a triangular shape, and the third magnetic substance 23 and the twenty-fifth magnetic substance 133 may have a rectangular shape or a bar shape.

In other embodiments, each of the magnetic substances 21, 22, 23, 131, 132, and 133 may have a rectangular shape, a circle shape, a cross shape, a polygonal shape, an ameba shape, an irregular shape or a combination thereof. Each of the magnetic substances 21, 22, and 23 may be alternately and repeatedly formed at the edge and inside of the first semiconductor chip 20.

Referring to FIG. 30, an underfill layer 17 may be formed between the substrate 10 and the first semiconductor chip 20. The first through electrodes 28 may be electrically connected to the substrate 10 via the first connection terminals 29 passing through or in the underfill layer 17.

Referring to FIG. 31, a first magnetic substance or member 21 and a second magnetic substance or member 22 may be formed on the first semiconductor chip 20. The second magnetic substance 22 may be spaced apart from the first magnetic substance 21. The first magnetic substance 21 and the second magnetic substance 22 may be close to an edge of the first semiconductor chip 20 (e.g., at an edge portion of the first semiconductor chip 20). The third magnetic substance 23 in FIG. 30 may be omitted in some embodiments.

Figure 32:
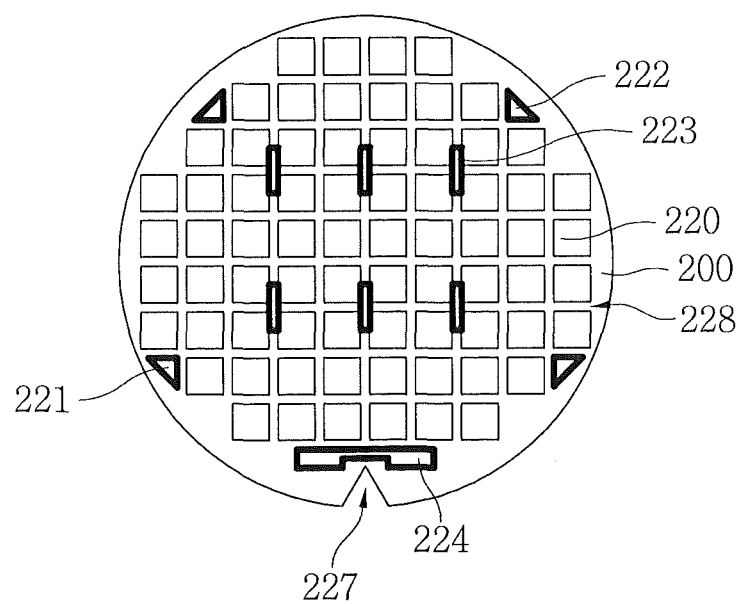
FIG. 32 is a plan view illustrating a method of forming a semiconductor package in accordance with embodiments of the inventive concept.
Figure 33:
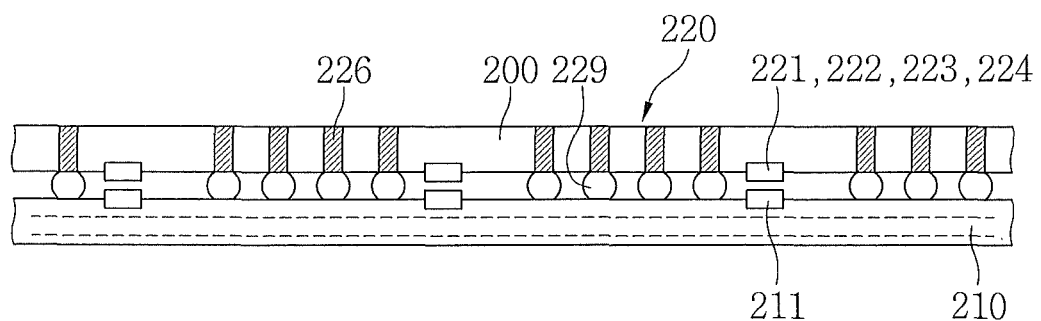
FIGS. 33 and 34 are cross-sectional views illustrating a method of forming a semiconductor package in accordance with embodiments of the inventive concept.
Figure 34:
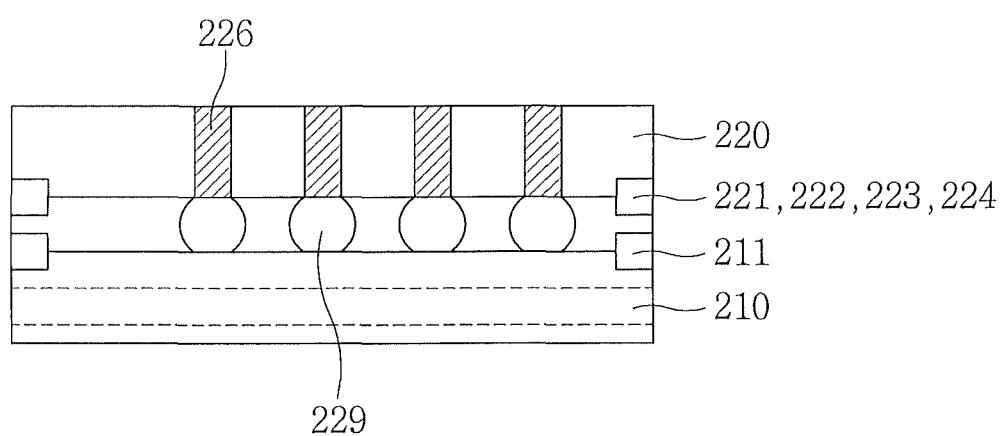

FIG. 32 is a plan view for describing a method of forming a semiconductor package in accordance with embodiments of the inventive concept, and FIGS. 33 and 34 are cress-sectional views for describing a method of forming a semiconductor package in accordance with embodiments of the inventive concept.

Referring to FIG. 32, a plurality of semiconductor chips 220 may be formed on a semiconductor wafer 200. The semiconductor wafer 200 may include a notch 227 and a scribe lane 228. A plurality of magnetic substances or members 221, 222, 223, and 224 may be formed on the semiconductor wafer 200. The magnetic substances 221, 222, 223, and 224 may be formed with various spaces and shapes on an edge of the semiconductor wafer 200, around the notch 227, in the scribe lane 228, in the semiconductor chips 220, or in a combination thereof.

Referring to FIG. 33, the semiconductor wafer 200 may be disposed on a substrate 210. Substrate magnetic substances or members 211 may be formed on the substrate 210 to face the magnetic substances 221, 222, 223, and 224. The magnetic substances 221, 222, 223, and 224 disposed on the semiconductor wafer 200 may be vertically arranged on or aligned with the substrate magnetic substances 211. The semiconductor chips 220 may include through electrodes 226. Connection terminals 229 may be formed between the substrate 210 and the semiconductor wafer 200.

Referring to FIG. 34, the semiconductor chips 220 may be separated by cutting along the scribe lane 228. The substrate 210 may be attached to a lower portion of the semiconductor chips 220.

Figure 35:
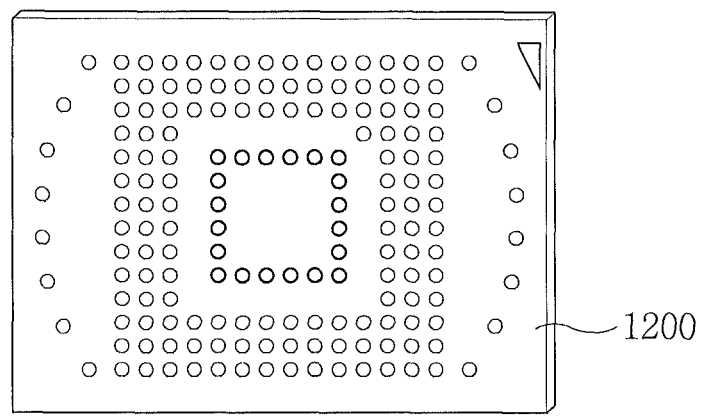
FIGS. 35 to 37 are perspective views illustrating electronic apparatuses in accordance with embodiments of the inventive concept.
Figure 36:
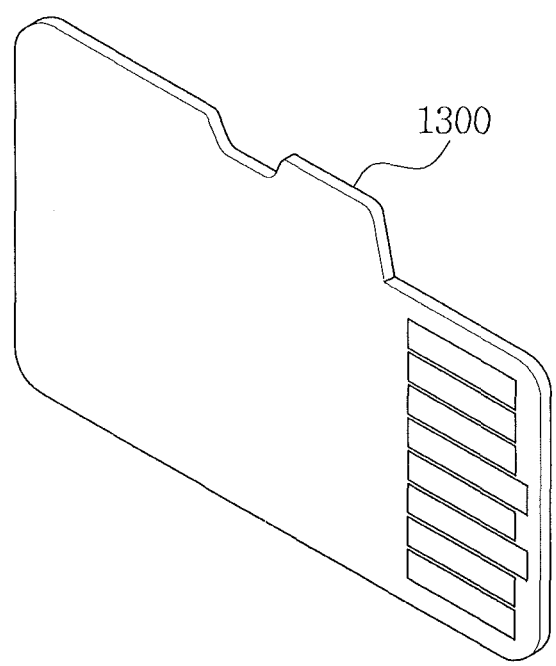
Figure 37:
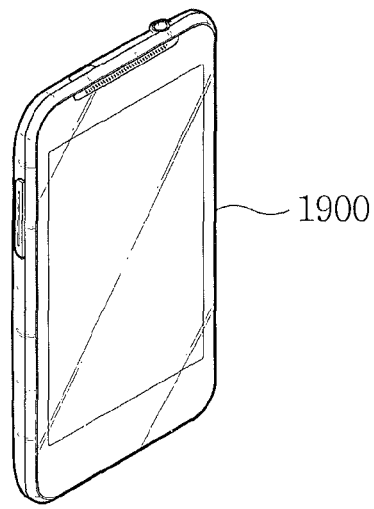
Figure 38:
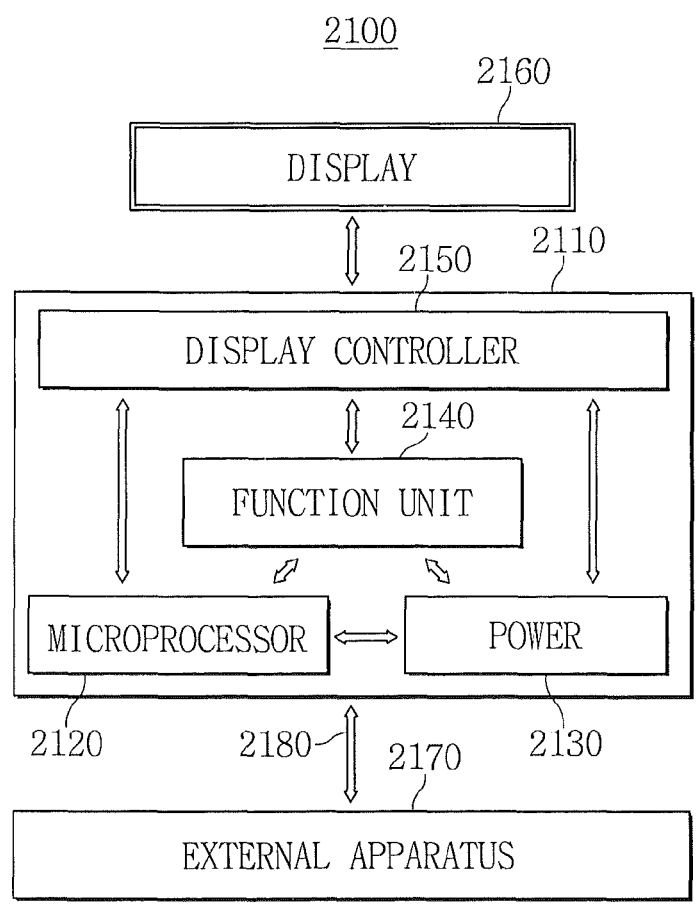
FIG. 38 is a system block diagram illustrating electronic apparatuses in accordance with embodiments of the inventive concept.

FIGS. 35 to 37 are perspective views illustrating electronic apparatuses in accordance with embodiments of the inventive concept, and FIG. 38 is a system block diagram illustrating electronic apparatuses in accordance with embodiments of the inventive concept.

Referring to FIGS. 35 to 37, the semiconductor package described with reference to FIGS. 1 to 34 may be usefully applied to electronic systems, such as an embedded multimedia chip (eMMC) 1200, a micro SD 1300, a smart phone 1900, a netbook, a notebook computer, or a tablet PC. For example, a semiconductor package similar to those described with reference to FIGS. 1 to 34 may be disposed on a main board in the smart phone 1900. A semiconductor device similar to those described with reference to FIGS. 1 to 34 may be provided to extension apparatus such as the micro SD 1300 and combined with the smart phone 1900 to be used.

Referring to FIG. 38, the semiconductor package similar to those described with reference to FIGS. 1 to 34 may be applied to an electronic system 2100. The electronic system 2100 may include a body 2110, a microprocessor unit 2120, a power unit 2130, a function unit 2140, and a display controller unit 2150. The body 2110 may be a mother board formed of a printed circuit board (PCB). The microprocessor unit 2120, the power unit 2130, the function unit 2140, and the display controller unit 2150 may be installed on the body 2110. A display unit 2160 may be disposed inside or outside of the body 2110. For example, the display unit 2160 may be disposed on a surface of the body 2110 and display an image processed by the display controller unit 2150.

The power unit 2130 may function to receive a constant voltage from an external battery (not shown), etc., divide the voltage into various required levels, and supply those voltages to the microprocessor unit 2120, the function unit 2140, and the display controller unit 2150, etc. The microprocessor unit 2120 may receive a voltage from the power unit 2130 to control the function unit 2140 and the display controller unit 2150 or the display unit 2160. The function unit 2140 may perform various functions of the electronic system 2100. For example, when the electronic system 2100 is a smart phone, the function unit 2140 may have several components which perform functions of the mobile phone such as output of an image on the display unit 2160 or output of a voice to a speaker, by dialing or communication with an external apparatus 2170. If a camera is installed, the function unit 2140 may function as a camera image processor.

In the embodiment to which the inventive concept is applied, when the electronic system 2100 is connected to a memory card, etc. in order to expand capacity, the function unit 2140 may be a memory card controller. The function unit 2140 may exchange signals with the external apparatus 2170 through a wired or wireless communication connection or unit 2180. When the electronic system 2100 needs a universal serial bus (USB), etc. in order to expand functionality, the function unit 2140 may serve as an interface controller. The function unit 2140 may include a mass storage apparatus.

A semiconductor package similar to those described with reference to FIGS. 1 to 34 may be applied to the function unit 2140 or the microprocessor unit 2120.

In accordance with an aspect of the inventive concept, a semiconductor package having a plurality of magnetic substances or members can be provided. The magnetic substances can serve to temper warpage caused at a semiconductor chip. Due to an existence of the magnetic substances, failures of connection terminals can be reduced or prevented.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A semiconductor package comprising:
    a substrate;
    a semiconductor chip disposed on the substrate;
    a first magnetic substance, a second magnetic substance and a third magnetic substance which are spaced apart from one another on the semiconductor chip; and
    a fourth magnetic substance, a fifth magnetic substance and a sixth magnetic substance which are spaced apart from one another on the substrate,
    wherein the first magnetic substance and the second magnetic substance are adjacent an edge of the semiconductor chip, the third magnetic substance is adjacent a center of the semiconductor chip, and the third magnetic substance is between the first magnetic substance and the second magnetic substance,
    wherein the fourth magnetic substance faces the first magnetic substance, the fifth magnetic substance faces the second magnetic substance, and the sixth magnetic substance faces the third magnetic substance,
    wherein a lower end of the first magnetic substance has the same magnetic polarity as an upper end of the fourth magnetic substance that faces the lower end of the first magnetic substance, a lower end of the second magnetic substance has the same magnetic polarity as an upper end of the fifth magnetic substance that faces the lower end of the second magnetic substance, and a lower end of the third magnetic substance has an opposite magnetic polarity from an upper end of the sixth magnetic substance that faces the lower end of the third magnetic substance.

2. The semiconductor package of claim 1, wherein each of the first magnetic substance, the second magnetic substance and the third magnetic substance protrudes from the semiconductor chip and between the substrate and the semiconductor chip.

3. The semiconductor package of claim 1, wherein the substrate includes a printed circuit board, an interposer, another semiconductor chip, or a combination thereof.

4. The semiconductor package of claim 1, wherein the semiconductor chip includes through electrodes.

5. A semiconductor package comprising:
    a substrate;
    a semiconductor chip disposed on the substrate;
    a first magnetic substance and a second magnetic substance which are spaced apart from each other on the semiconductor chip; and
    a third magnetic substance and a fourth magnetic substance which are spaced apart from each other on the substrate,
    wherein the first magnetic substance and the second magnetic substance are adjacent an edge of the semiconductor chip,
    wherein the third magnetic substance faces the first magnetic substance, and the fourth magnetic substance faces the second magnetic substance,
    wherein a lower end of the first magnetic substance has the same magnetic polarity as an upper end of the third magnetic substance that faces the lower end of the first magnetic substance, and a lower end of the second magnetic substance has the same magnetic polarity as an upper end of the fourth magnetic substance that faces the lower end of the second magnetic substance.

6. The semiconductor package of claim 5, further comprising:
    a fifth magnetic substance disposed on the semiconductor chip between the first magnetic substance and the second magnetic substance; and
    a sixth magnetic substance disposed on the substrate that faces the fifth magnetic substance.

7. The semiconductor package of claim 6, wherein a lower end of the fifth magnetic substance has an opposite magnetic polarity from an upper end of the sixth magnetic substance that faces the lower end of the fifth magnetic substance.

8. A semiconductor package comprising:
    a substrate;
    a semiconductor chip disposed on the substrate;
    a first magnetic member and a second magnetic member which are spaced apart from each other on the semiconductor chip; and
    a third magnetic member and a fourth magnetic member which are spaced apart from each other on the substrate,
    wherein the first magnetic member and the second magnetic member are at an edge portion of the semiconductor chip,
    wherein the third magnetic member is aligned with and faces the first magnetic member, and the fourth magnetic member is aligned with and faces the second magnetic member,
    wherein a lower end of the first magnetic member has the same magnetic polarity from an upper end of the third magnetic member that faces the lower end of the first magnetic member, and a lower end of the second magnetic member has the same magnetic polarity from an upper end of the fourth magnetic member that faces the lower end of the second magnetic member.

9. The semiconductor package of claim 8, further comprising:
    a fifth magnetic member disposed on the semiconductor chip at a center portion thereof and between the first magnetic member and the second magnetic member; and
    a sixth magnetic member disposed on the substrate that is aligned with and faces the fifth magnetic member.

10. The semiconductor package of claim 9, wherein a lower end of the fifth magnetic member has an opposite magnetic polarity from an upper end of the sixth magnetic member that faces the lower end of the fifth magnetic member.

11. The semiconductor package of claim 1, wherein the first magnetic substance is at a first corner portion of the semiconductor chip, the second magnetic substance is at a second corner portion of the semiconductor chip, and the third magnetic substance is at a center portion of the semiconductor chip.

12. The semiconductor package of claim 11, wherein the first and second magnetic substances each have a triangular shape.

13. The semiconductor package of claim 11, wherein the third magnetic substance has a rectangular shape.

14. The semiconductor package of claim 1, wherein a lower end of the first magnetic substance has an opposite magnetic polarity as a lower end of the third magnetic substance, and the lower end of the first magnetic substance has the same magnetic polarity as a lower end of the second magnetic substance.

* * * * *